(12) United States Patent
Vibet et al.

(10) Patent No.: US 6,646,279 B2
(45) Date of Patent: Nov. 11, 2003

(54) APPARATUS FOR EXPOSING A FACE OF A PRINTED CIRCUIT PANEL

(75) Inventors: Gilles Vibet, Le Petit Quevilly (FR); Alain Sorel, Les Baux Saint Croix (FR)

(73) Assignee: Automa-Tech, Val de Reuil (FR)

( * ) Notice: Subject to any disclaimer, the term of this patent is extended or adjusted under 35 U.S.C. 154(b) by 17 days.

(21) Appl. No.: 10/109,225

(22) Filed: Mar. 28, 2002

(65) Prior Publication Data

US 2002/0167788 A1 Nov. 14, 2002

(30) Foreign Application Priority Data

Mar. 28, 2001 (FR) .............................................. 01 04186

(51) Int. Cl.[7] .............................................. G01N 21/86
(52) U.S. Cl. ..................... 250/548; 250/559.3; 250/216
(58) Field of Search .............................. 250/548, 559.3, 250/208.1, 216; 356/399–401; 355/53, 55, 60

(56) References Cited

U.S. PATENT DOCUMENTS 4,258,395 A * 3/1981 Nodov ........................ 358/494

* cited by examiner

*Primary Examiner*—Que T. Le
(74) *Attorney, Agent, or Firm*—James Ray & Associates (57) ABSTRACT

An apparatus for exposing a light sensitive surface (e.g., a printed circuit board) to light. An optical processor subsystem, which includes a reflector and an integrator-collimator assembly, processes light from a light source to produce a uniform and collimated light beam having a mean angle of incidence relative to the light sensitive surface of less than or equal to 2° and having illumination uniformity that departs by less than ±10% from a mean value. An optical light shaper subsystem transforms the uniform and collimated light beam into a uniform and collimated light strip. A displacement mechanism provides relative movement between the light strip and the light sensitive surface. A speed matching mechanism matches the speed of relative displacement to the brightness of the light strip and to the sensitivity of the light sensitive surface. The light source remains stationary in one construction and moves relative to the light sensitive panel in another construction.

28 Claims, 8 Drawing Sheets

FIG.12

APPARATUS FOR EXPOSING A FACE OF A PRINTED CIRCUIT PANEL

The present invention relates to apparatus for exposing at least one face of a panel, in particular a printed circuit panel.

BACKGROUND OF THE INVENTION

Such apparatuses are used for manufacturing printed circuits from a panel coated in a photosensitive material that is to have artwork placed in front of it bearing the pattern of tracks to be generated on the printed circuit. A light beam passes through the artwork and thus serves to expose the panel.

Such exposure apparatuses are known, e.g. from European patents EP 618 505, EP 807 505, and EP 807 856, in which the light source and the panel to be exposed are both stationary and exposure is performed over the entire surface that is to be exposed without scanning.

However, in that type of apparatus where the entire surface is exposed simultaneously, the chemical reactivity of the photosensitive material is not optimum. The efficiency of the reaction is improved when exposure is stronger and instantaneous exposure time shorter.

Such apparatuses are also known in which the surface of the panel is exposed by scanning, with a light beam coming from a light source being reflected on a rotary mirror.

Unfortunately, the definition with which tracks are drawn, and the fineness of such tracks is directly related to the angle of incidence of the light beam on the artwork. Each light beam occupies a circular cone about an axis that is inclined at a greater or lesser angle relative to the surface that is to be exposed, and that is referred to as declination. The half-angle at the apex of the cone represents collimation, i.e. the degree of parallelism between light rays. It will thus be understood that the angle of incidence of a light beam depends both on its collimation and on its declination. Consequently, when the light is not collimated and/or when some of the light beams reach the surface for exposure at an angle of incidence that is too large, the size of the tracks and the paths they follow are generally modified relative to the artwork.

Similarly, when exposure is not performed uniformly, then tracks are formed unequally and the quality of the resulting printed circuit is poor.

OBJECTS AND SUMMARY OF THE INVENTION

The object of the invention is to provide an exposure apparatus that makes it possible to improve exposure of a surface by scanning, in particular for manufacturing printed circuits, by providing a strip of light which presents both a good uniformity and a good angle of incidence relative to the panel.

Such apparatus makes it possible to make printed circuits having a conductor track density that is very high, and it ensures that the tracks are very fine and follow very accurate paths, i.e. it ensures that the surface for exposure is perfectly exposed. The size of the conductor tracks of printed circuits that are to be made using such apparatus lies in the range 25 micrometers ($\mu$m) to 50 $\mu$m, and they are spaced apart by approximately the same amount.

It will thus be understood that a light beam reaching the surface to be exposed at a poor angle of declination produces a parallax error causing the light to be offset on the surface to be exposed, thereby shifting the conductor tracks away from the design location. The same applies to the size of the tracks which increases and becomes less precise with worsening collimation of the beam relative to the surface to be exposed. Under extreme circumstances, those two phenomena taken together can lead to short circuits because tracks touch each other.

In addition, the quality of development, i.e. the quality of removal of that portion of the photosensitive material which is not to overlie future tracks during etching, and consequently the quality of that etching, depends on prior transformation of the photosensitive material, which transformation is itself related to the quantity of light energy received. It will thus be understood that when the light beam is not uniform, it gives rise to non-uniform transformation of the photosensitive material and thus to tracks following paths that are imprecise and in extreme cases this can lead to tracks being interrupted.

Throughout the description below, the term "light strip" is used to designate the set of light beams reaching the surface to be exposed, and the term "mean angle of incidence" corresponds to the angle measured in any plane substantially transversal to the plane of the surface to be exposed and within which half of the light flux reaches the surface, the other half reaching the surface at any angle.

Each light beam lies in a circular cone of axis substantially perpendicular to the plane of the surface to be exposed. Under such circumstances, the half-angle at the apex which represents collimation is less than or equal to the mean angle of incidence.

Since the length of the light strip is not less than the length of one of the sides of the panel to be exposed, it suffices to scan in a single direction in order to expose the entire surface of the panel. The light strip is moved relative to the surface to be exposed (or vice versa) in a direction extending transversely to the length of the light strip so as to scan the entire surface. The direction in which the panel is scanned corresponds to the direction of one of the sides of the panel. Thus, by generating a light strip in a first direction parallel to one of the sides of the panel, scanning is performed in a second direction substantially transversal to said first direction.

In addition, since the zone that is illuminated during exposure forms a strip, scanning time is reduced by using a narrow light pencil of flux density greater than when exposing the entire surface. For equal flux density, the greater the height of the quadrilateral constituted by the light strip, the shorter the scanning time. However, the greater the height of the quadrilateral, the more difficult it is to obtain light at a small angle of incidence which is collimated and uniform over the entire quadrilateral, and the lower the flux density. It is therefore necessary to find a compromise.

In addition, it must be possible to guarantee identical exposure throughout scanning, i.e. that the uniformity and the angle of incidence of the light beam remain constant throughout displacement of the strip of light.

In a first aspect, the present invention provides apparatus for improving the exposure of a surface, in particular for manufacturing printed circuits, by processing a light beam emitted from a single stationary light source.

In this first aspect, the invention provides apparatus comprising:

means for holding at least one artwork and said panel on a frame;

an optical system comprising a light source emitting a light beam, processor means for processing said light beam to generate a uniform and collimated light beam having a mean angle of incidence relative to the surface to be exposed of less than 2° and having illumination uniformity that departs by less than ±10% from a mean value, and shaper means enabling said uniform and collimated light beam to be transformed into a uniform and collimated light strip on the surface of the panel to be exposed and including said artwork, said uniform and collimated light strip being of length not less than the length of one of the sides of said surface to be exposed, said means for processing the light beam comprising a reflector and an integrator-collimator assembly;

displacement means for generating relative displacement between said light strip and said face to be exposed in a direction substantially transverse to the longitudinal direction of said light strip; and matching means for matching the speed of relative displacement between said light strip and said face to be exposed to the illumination of the light strip and to the sensitivity of the surface to be exposed.

In the usual case of panels that are substantially rectangular, it will be understood that scanning is accelerated by being performed in a direction parallel to the width of the panel, i.e. when the light strip is parallel to the long direction of the panel. In this first circumstance, the length of the light strip is not less than the length of the long side of the panel and scanning takes place in the short side direction.

For reasons of size, it can be necessary to turn the panel relative to that first configuration and scan it in its long direction. In this second configuration, the length of the light strip is not less than the width of the panel and scanning takes place in the long side direction.

Advantageously, all the optical system is stationary so that the optical means contained therein are not subjected to unwanted loss of adjustment that could degrade the uniform and collimated light beam that leaves said assembly.

At the inlet to the integrator-collimator assembly placed after the light source, the light is neither collimated nor distributed in uniform manner, whereas at the outlet therefrom it is distributed uniformly, e.g. with an error of less than ±10% for a light strip measuring 780 millimeters (mm) by 170 mm, and it is collimated with a mean angle of incidence of less than 2°, and preferably less than 1°.

Advantageously, the integrator-collimator assembly comprises a first optical processor unit for spreading the light in substantially uniform manner and a second optical processor unit, said second unit being placed after said first unit and serving to collimate the light.

For reasons of cost and feasibility, each optical processor unit performs a specific function (either collimation and declination or else homogenization).

It will thus be understood that the characteristics of the optical processor unit and their respective dispositions determine the properties of the light beam obtained at the outlet from the integrator-collimator assembly.

Thus, advantageously, the first optical processor unit is placed firstly at a second focus of said reflector so that said first optical processor unit can process said light beam entering therein to deliver an outlet light beam that is uniform, and secondly at the object focus of said second optical processor unit so that said second unit can process the uniform light beam entering it to produce a light beam that is uniform and collimated.

Since the light is uniform, variation in exposure power at any point of the light strip is controlled and does not exceed extreme values that would run the risk of damaging the tracks. Similarly, since the light is collimated, the light rays are mutually parallel and all of them arrive at an angle of incidence smaller than 2°.

The integrator-collimator assembly also advantageously comprises a first mask placed in the vicinity of said first optical unit and a second mask placed in the vicinity of said second optical unit.

The first mask serves to eliminate a fraction of the (non-uniform, non-collimated) light radiation having a mean angle of incidence that is too far removed from the mean propagation direction at the outlet from the reflector, while the second mask has the same function for the uniform light beam that has passed through the first optical processor unit. These two masks perform coarse collimation by removing rays that diverge excessively, and by doing so on two successive occasions prior to the light entering the second optical unit that serves to perform collimation. Collimation is thus more effective in that the diverging rays have already been eliminated.

The temperature of the artwork is an important factor in determining the quality with which the printed circuit is made since any temperature gradient leads to the artwork becoming deformed, and thus to deformation in the paths followed by the tracks. For example, a temperature difference of as little as 2° C. can lead to image distortion.

Thus, in order to minimize temperature variations in the artwork, the apparatus advantageously includes a dichroic mirror.

Infrared radiation is not useful for exposure but it does heat adjacent elements, and in particular the artwork, so it is advantageous for the anti-heat filter to separate the light beam into infrared and ultraviolet portions, and then for the panel to be exposed with "cold" light, i.e. light that is essentially ultraviolet.

The shaper means advantageously comprise a first mirror which is diverging and convex and a second mirror which is converging and concave, the mirrors being placed in succession at the outlet from said integrator-collimator assembly.

At the inlet to the shaper means, the light beam is uniform and collimated, but it is still not in the form of a light strip but is generally in the form of a two-dimensional rectangle that is much smaller in size than the size desired for scanning along one of the sides of the panel. The first mirror serves to de-collimate the light beam in the plane of the mirror by causing it to diverge in one of the two dimensions so as to spread out the light beam into a strip of light of length greater than its initial length.

The second mirror serves to re-collimate the light beam in the same plane by making it converge in the same dimension so that the light strip has collimation properties that are identical to those of the light beam entering the shaper system.

The uniformity of the light beam and thus of the light strip remains unchanged throughout shaping.

The positions of the mirrors relative to the integrator-collimator assembly has no influence on the properties of the light strip, but it will be understood that their positions relative to each other, and in particular the spacing between them and the characteristics of said mirrors determine the shape of the light strip.

Thus, the length of said uniform and collimated light strip is advantageously a function of the spacing between said converging and diverging mirrors, and of the radii of curvature of said mirrors, and in particular the radius of curvature of the diverging mirror. The height of the light strip depends on the geometrical characteristics of the collimating lens and of its support. The height of the light strip is affected very little by the converging and diverging mirrors.

The displacement means advantageously comprise a plane mirror that is movable in the plane defined by the axes of the face of the panel to be exposed.

This mirror has no effect on the properties of the light strip and it is placed at the outlet of the optical system that has served to process and to shape the light beam. The mirror is the only moving part of the apparatus and it enables the entire surface to be exposed in succession by scanning, reflecting a light strip that moves in translation towards the panel to be exposed.

Naturally, the dimensions of the mirror are matched to the desired length of the light strip so as to avoid unwanted shortening of said length.

Since the shape of the light strip is determined directly by the selected shaper optical system it is easily modified.

To obtain better power uniformity, the light source is advantageously placed at a first focus of the reflector. When using an arc lamp, it is preferably the arc which is placed at the first focus of the reflector.

Thus, a very large fraction of the light emitted by the light source is reflected towards the second focus of the reflector which corresponds to the inlet to the processor and shaper system constituted by the first optical processor unit for processing and shaping.

In a second aspect, the invention provides apparatus for improving exposure of a surface, in particular for manufacturing printed circuits, by using a moving light source.

In this second aspect, the invention provides apparatus comprising:

means for holding at least one artwork and said panel on a frame;

an optical system comprising at least one light box containing a light source and a reflector comprising at least a first parabola having a first focus and a second parabola having a second focus, said first and second focuses being situated on the axis corresponding to a direction for scanning said face to be exposed, the light source being placed at said first focus to generate a light strip on the surface of the panel to be exposed and including said artwork, the mean angle of incidence of the light strip being less than 15° and the uniformity of its illumination presenting departures of less than ±10% relative to a mean value, said light strip being of length not less than the width of said surface to be exposed;

displacement means for generating relative displacement between said light strip and said face to be exposed in the length direction of said face to be exposed, which direction is substantially transverse to the longitudinal direction of said light strip; and matching means for matching the relative displacement speed between said light strip and said face to be exposed to the illumination of the light strip and to the sensitivity of the surface to be exposed.

The specific shape of the reflector determines the properties and shape of the light beam.

Advantageously, said first parabola is situated in a first plane defined by axes including said scanning direction, and said second parabola is situated in a second plane defined by the axes including said scanning direction and substantially transversal to said first plane.

To make such a reflector easier to manufacture and to reduce costs, the reflector is advantageously built up from two symmetrical portions. In addition, to make it easier to change the lamp, the reflector advantageously includes a central opening.

In order to obtain a light strip measuring approximately 635×130 $mm^2$, the optical system advantageously comprises five light boxes in alignment along the direction extending transversely to said scanning direction, which boxes are moved in translation in the scanning direction, i.e. in a direction that is substantially transversal to the length of the light strip so as to scan the entire panel. In this optical configuration, the mean angle of incidence obtained with five medium arc lamps is about 11°. Medium arc lamps make it more difficult to collimate the beam, but they make it easier to superpose the light sources.

Naturally, in order to obtain a light strip of different shape, it is appropriate to adjust the number of light boxes and their light-emitting power, and also their respective arc lengths, and possibly also to modify the reflector.

The spacing between the boxes is preferably 145 mm, with it being possible to perform adjustments in the longitudinal direction of the light strip in order to compensate for inaccuracies in light box manufacture.

In both of the above aspects of the invention and at any given instant, the collimated light strip advantageously forms a quadrilateral on the surface to be exposed, having height lying in the range 100 mm to 150 mm and length that is not less than the length of one of the sides of the surface to be exposed.

In order to generate the light strip, said light source advantageously comprises a medium or short arc electric discharge lamp.

In general, short arcs have a length of less than 10 mm and medium arcs have a length lying in the range 10 mm to 25 mm. Beyond 25 mm, the lamp is said to have a "long" arc. The shorter the arc of the lamp, the better the collimation; however, short arc lamps require a more sophisticated power supply.

Thus, depending on the type of lamp and the type of optical system selected, the light strip advantageously presents a mean angle of incidence that is less than or equal to 2° or 15°.

The apparatus advantageously further comprises calibration means for calibrating the light source or for calibrating each of the light sources independently of one another when there are several light sources.

In the presence of a plurality of light sources, the calibration means advantageously comprise a single sensor which is moved successively in front of each light source. On the basis of the light intensity measured for one source, the signal from the sensor acts via a servo-control loop to control power supply regulation for the corresponding light source, and thus to control the light power emitted thereby.

Once the power of each light source has been adjusted, uniform power is obtained over the light strip. Given the mean value of this power and the nature of the surface to be exposed, a computer in the apparatus adjusts scanning of the light strip, matching the travel speed of the light strip to the light power and to the nature of the surface to be exposed, so as to obtain the desired exposure conditions.

BRIEF DESCRIPTION OF THE DRAWINGS

The invention will be well understood and its advantages will appear better on reading the following detailed description of embodiments given as non-limiting examples.

The description refers to the accompanying drawings, in which.

MORE DETAILED DESCRIPTION

In a first aspect of the invention, the exposure apparatus for manufacturing printed circuits as shown in FIGS. 1 to 6 comprises an optical system made up of a discharge lamp and various optical elements. In this configuration, the lamp and a processor and shaper unit for acting on the light beams emitted by the lamp, and also the panel to be exposed are all stationary, and a single optical element, specifically a mirror, serves to scan the surface of the panel to be exposed.

Figure 1:
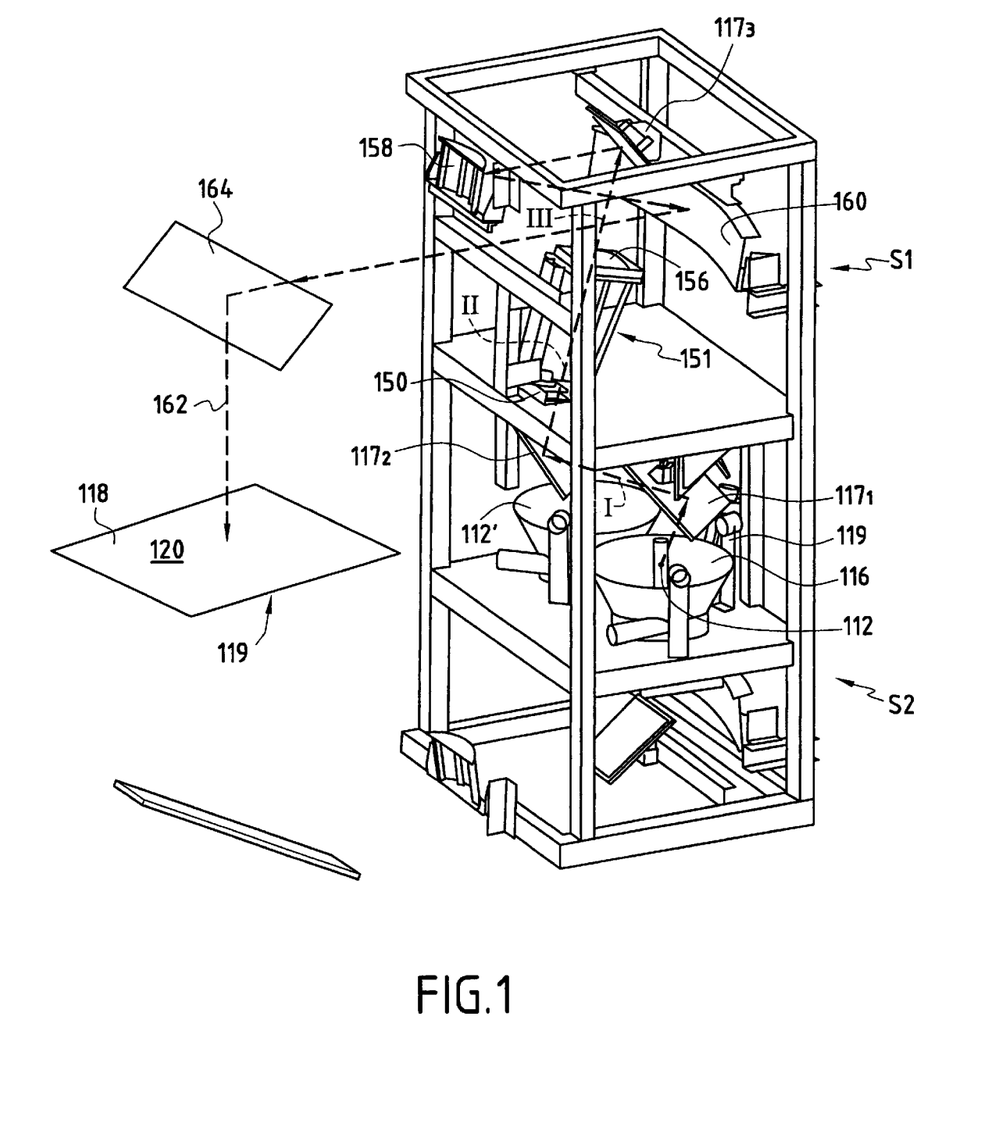
FIG. 1 is a perspective view of the exposure apparatus in a first aspect of the invention.

FIG. 1 is an overall view of such apparatus together with a panel 120 to be exposed, the apparatus comprising an optical system $S_1$ for processing and shaping a light beam emitted by a light source 112 so that it constitutes a strip. Specifically, the apparatus comprises two optical systems $S_1$ and $S_2$ for processing and shaping two light beams emitted by two respective light sources 112 and 112' which are placed side by side so as to expose both faces of the panel. It suffices to place two similar optical systems $S_1$ and $S_2$ on either side of the panel 120 in the vicinity of each of the two faces to be exposed. The two systems $S_1$ and $S_2$ are then controlled simultaneously or independently depending on the apparatus in question.

As shown in FIG. 1, when the light sources 112 and 112' are arc lamps, e.g. of the xenon mercury type, they need to face upwards in order to operate. Thus, both lamps 112 and 112' face in the same direction. The processor and shaper system $S_1$, or $S_2$ as the case may be, is specific to a respective one of the lamps 112 and 112' and the systems are placed on either side of the lamps 112 and 112' in symmetrical manner.

The description below relates to a single lamp and a single processor and shaper system, specifically the processor and shaper system $S_1$.

To make the exposure apparatus more compact, it includes a plurality of mirrors that do not process the light beam, but that serve to form bends in the apparatus and in particular in the processor and shaper system $S_1$.

These mirrors are preferably simple plane mirrors. They have no effect on the processing or shaping of the beam. Nevertheless, it is preferable for them to be treated so as to be dichroic, thereby serving an anti-heat filters separating the light beam into infrared and ultraviolet. Such surface treatment makes it possible to reflect about 97% of the ultraviolet radiation while allowing about 70% of the infrared radiation to pass through. Since infrared is not of any use for exposure, but does heat up the artwork (not shown) and adjacent elements, in particular the optical units, it will be understood that it is advantageous to separate the infrared out from the light beam as soon as possible, and in particular before it passes through the processor and shaper system.

Figure 2:
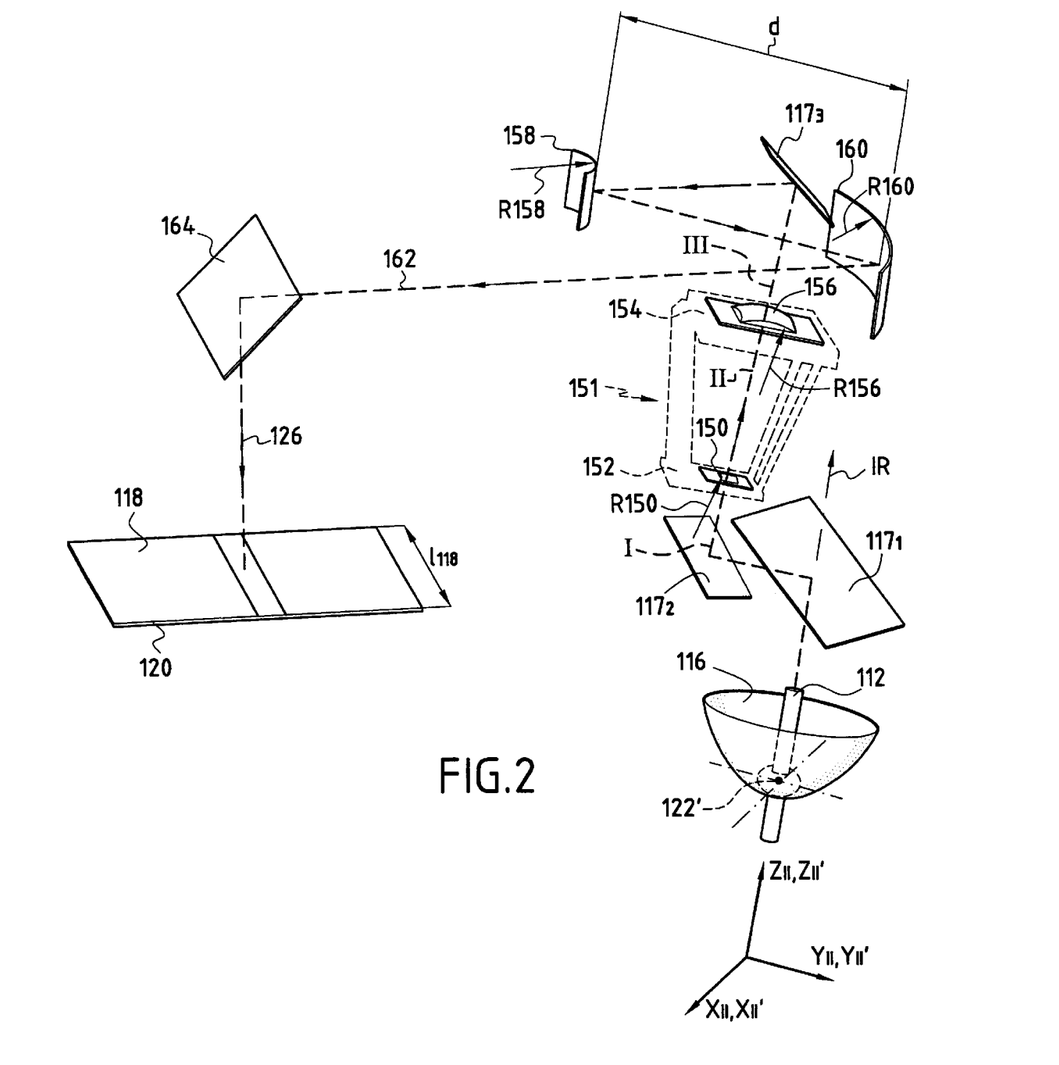
FIG. 2 is a diagram showing the path followed by a light ray in the FIG. 1 apparatus.

FIG. 2 is a diagram of such an optical system comprising a short arc discharge lamp 112, e.g. operating at a power of 5 kilowatts (kW) or 8 kW, the lamp being placed at the first focus 122' of an elliptical reflector 116. It is preferable to use a 5 kW lamp 112 generating an arc measuring 3×3×7 mm³.

The axis on which the various optical elements are placed is referenced $Z_{II}Z_{II}'$, corresponding to the axis of revolution of the reflector 116 which is constituted by a fraction of an ellipsoid and passing through both focuses 122' and 124' of said reflector 116. The axis $Z_{II}Z_{II}'$ is substantially vertical and corresponds to the propagation axis of the light beam leaving the lamp 112 and the reflector 116. Two axes $X_{II}X_{II}'$ and $Y_{II}Y_{II}'$ are substantially perpendicular to the axis $Z_{II}Z_{II}'$ so as to define an orthogonal frame of reference.

On leaving the lamp 112 and the reflector 116, a large fraction of the infrared IR is dumped through a first mirror $117_1$ which is preferably cooled by a cooling system 119 that blows cold air. This first mirror $117_1$ is placed at 45° above the lamp 112 and it reflects the light beam I towards a second mirror 117 (see FIGS. 1 and 2). This second mirror $117_2$ faces upwards, preferably at 45°, so that the light beam I is reflected towards the inlet of the processor and shaper system which begins with an integrator-collimator assembly 151.

Figure 3:
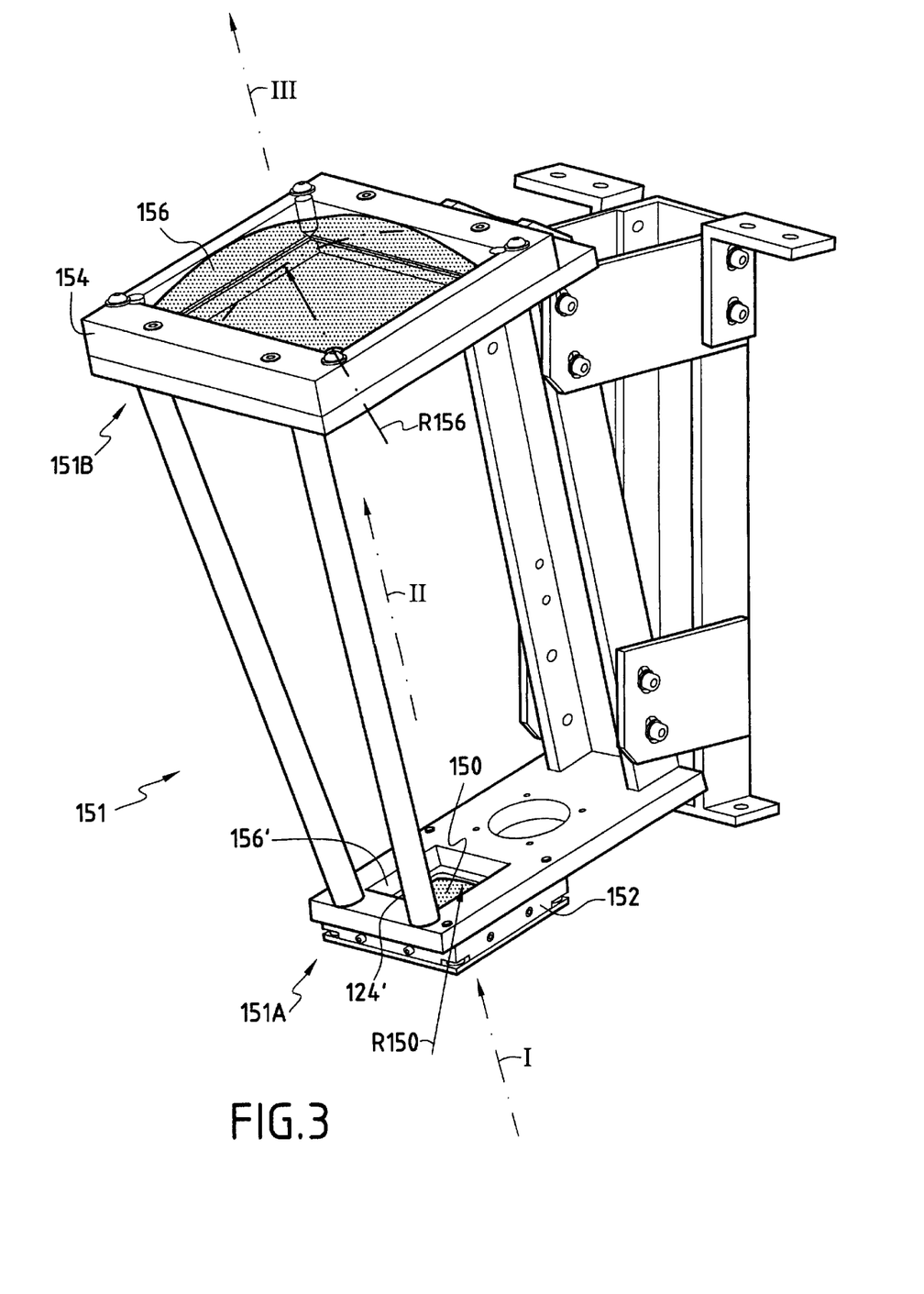
FIG. 3 is a perspective view of the integrator-collimator assembly.

This integrator-collimator assembly 151, which is shown in detail in FIG. 3, comprises an assembly of various optical surfaces serving firstly to average out illumination and spread the light intensity so as to make it uniform, and secondly to collimate it.

The axis of the integrator-collimator assembly 151 coincides with the axis $Z_{II}Z_{II}'$ and at its inlet 151A it has a first processor optical unit constituted by an integrating lens 150, and its outlet 151B it has a second optical processor unit, constituted by a collimating lens 156. Each of these lens 150 and 156 is placed in a respective support 152 or 154. In the optical system shown, the two supports 152 and 154 are preferably constituted by masks and they extend substantially perpendicularly to the axis $Z_{II}Z_{II}'$ so as to eliminate any radiation at an angle of incidence that is too far removed from the mean propagation direction at the outlet from the reflector 116 and so that the optical axis of the integrator-collimator assembly 151 coincides with the axis $Z_{II}Z_{II}'$ so as to obtain a good angle of declination for the beam on the surface to be exposed.

The integrating lens 150 is a convex cylindrical lens of curvature directed towards the collimator lens 156 and of radius of curvature $R_{150}$ lying in the range 30 mm to 40 mm, and preferably being substantially equal to 35 mm.

The integrating lens 150 is placed at the second focus 124' of the reflector 116. At the inlet of the integrator-collimator assembly 151, the light rays I are in the form of a circular cone of height extending substantially along the axis $Z_{II}Z_{II}'$. At the inlet to the cylindrical lens 150, the light beam I is not uniform nor is it collimated, whereas at the outlet the light beam II is uniform with differences of intensity of less than ±10%. The light beam II is also collimated to a very small extent by the support 152.

The light beam II continues along its path towards the collimator lens 156 which is constituted by a spherical lens of curvature directed towards the outlet of the integrator-collimator assembly 151 and which has a radius of curvature $R_{156}$ lying in the range 150 mm to 200 mm, and is preferably substantially equal to 170 mm.

The spherical lens 156 is spaced apart from the cylindrical lens 150 so that the lens 150 lies at the object focus 156' of the spherical lens 156. At the outlet from the spherical lens 156, the light beam III is collimated having a mean angle of incidence of about 1°.

The two focuses 124' and 156' thus coincide and the spherical lens 156 and the reflector 116 are disposed on opposite sides of the cylindrical lens 150. Consequently, at the outlet from the integrator-collimator assembly 151, the light beam III is uniform with departures from uniformity of less than ±10% and it is collimated.

The focuses of the lenses 150 and 156 of the integrator-collimator assembly 151 are disposed on the same axis as the second focus 124' of the lamp 112, i.e. along the axis $Z_{II}Z_{II}'$ so that the light beam presents declination that is as small as possible, enabling it to expose the surface of the panel to be exposed substantially perpendicularly.

Thus, at the outlet from the integrator-collimator assembly 151, the light beam III is uniform with departures from uniformity of less than ±10% and it presents a mean angle of incidence of about 1°.

Returning to FIGS. 1 and 2, a third mirror $117_3$ is placed at the outlet from the integrator-collimator assembly 151 to form the last bend in the light path III.

The shaper means comprise shaper optical units placed immediately after the third mirror $117_3$, serving in succession to decollimate the light beam by causing it to diverge, and then to recollimate the light flux III again so as to obtain a light strip 162.

For example, a first shaper optical unit, specifically a diverging mirror 158, is placed after the second mask 154 supporting the spherical lens 156 to face the mirror $117_3$, and a second shaper optical unit, specifically a converging mirror 160, is placed after the diverging mirror 158. The two mirrors 158 and 160 face each other, and they are preferably inclined as much as possible towards the horizontal plane ($X_{II}X_{II}'$, $Y_{II}Y_{II}'$) so as to avoid any optical aberration. Specifically, the two mirrors 158 and 160 are less than 45° off the axis $Y_{II}Y_{II}'$. The diverging mirror 158 is a convex mirror of curvature directed towards the converging mirror 160 and of radius of curvature $R_{158}$ which preferably lies in the range 150 mm to 200 mm. The converging mirror 160 is a concave mirror of curvature directed in the same direction as the diverging mirror 158 and of radius of curvature $R_{160}$ that preferably lies in the range 1200 mm to 1500 mm.

Figure 4:
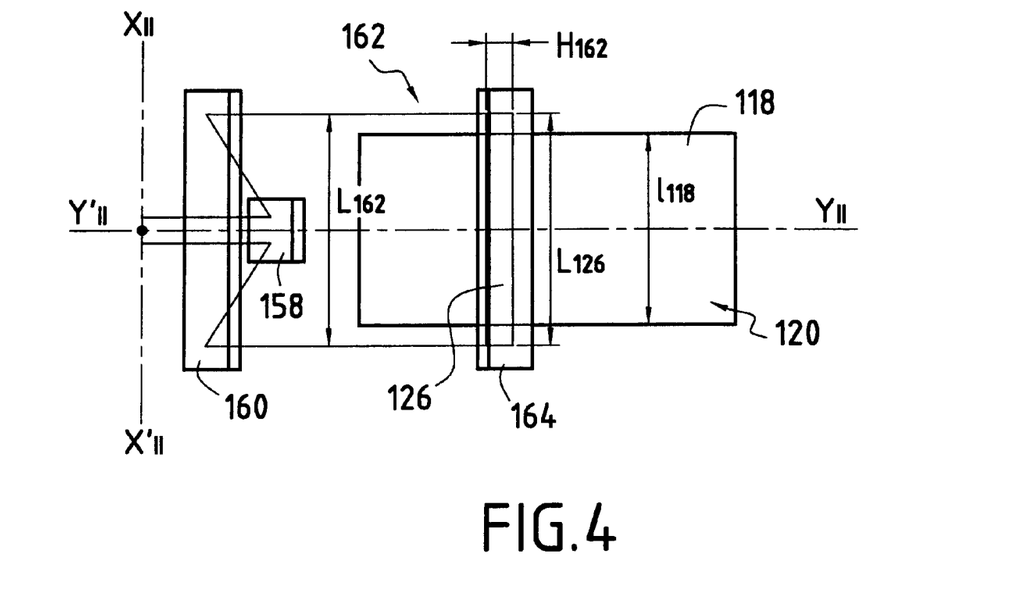
FIG. 4 is a diagrammatic view of the FIG. 1 apparatus seen from above.

In this configuration, the two mirrors 158 and 160 serve to obtain a light strip 162 (shown in FIG. 2) of length $L_{162}$ (shown in FIG. 4). The length $L_{162}$ is a function of the radius of curvature $R_{158}$ of the diverging mirror 158 and of the spacing d between the diverging and converging mirrors 158 and 160. The width or height $H_{162}$ of the light strip 162 depends on the geometrical characteristics of the mask 154 and in particular on the characteristics of the spherical lens 156.

It should be added that the radius of curvature of the mirror 160 can have a small effect on the length $L_{162}$ of the light strip. For industrial reasons, this radius of curvature remains constant.

A fourth mirror 164 is placed facing the converging mirror 160 so as to reflect the light strip towards the surface 118 of the panel to be exposed 120 which lies in the horizontal plane ($X_{II}X_{II}'$, $Y_{II}Y_{II}'$).

As shown in FIG. 4, this fourth mirror 164 is intended to reflect all or part of the length $L_{162}$. Thus, depending on the width of the mirror 164, a length $L_{126}$ is obtained for the light strip 126 that reaches the surface 118 to be exposed of the printed circuit panel 120 which is held in a frame (not shown).

Taking the axis $X_{II}X_{II}'$ as the horizontal axis corresponding to the width direction of the surface 118 of the panel to be exposed 120 placed substantially horizontally, in a plane parallel to the axes $X_{II}X_{II}'$ and $Y_{II}Y_{II}'$ (shown in FIGS. 2, 4, and 5), it suffices to move the mirror 164 along the axis $Y_{II}Y_{II}'$, i.e. along the length of the surface 118 to be exposed so as to scan the entire surface 118. This fourth mirror 164 is thus the only optical element in the apparatus that moves.

It will be understood that the surface 118 of the panel can be placed in some other manner. Thus, when it is the length direction of the surface to be exposed that is placed along the axis $X_{II}X_{II}'$, then scanning takes place in the width direction of the surface to be exposed, i.e. still along the axis $Y_{II}Y_{II}'$.

Scanning is always performed transversely to the longitudinal direction of the light strip, and this scanning direction is preferably parallel to the width or at least to the length of the surface to be exposed.

Figure 5:
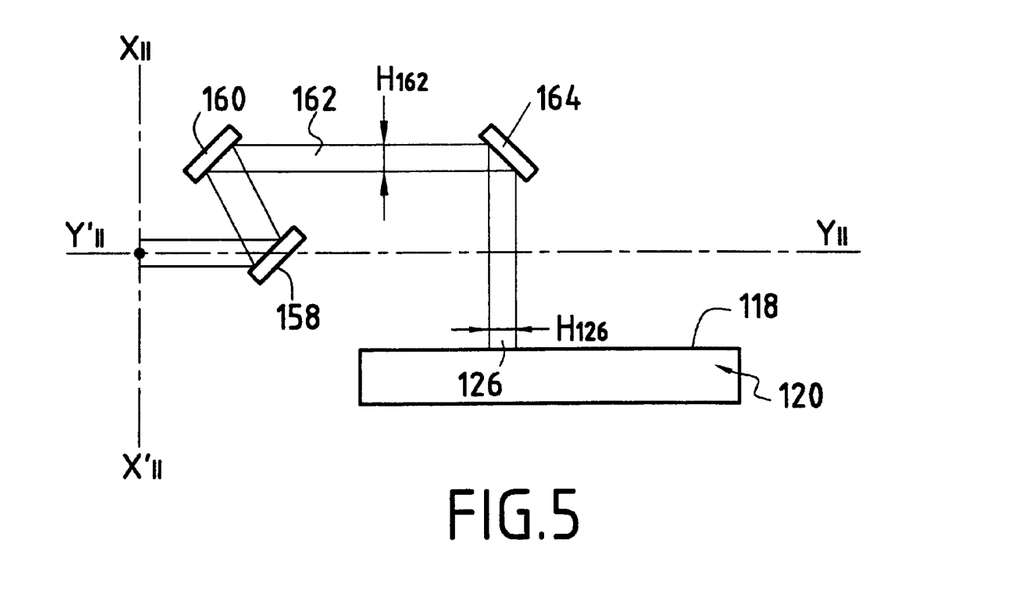
FIG. 5 is a diagrammatic view corresponding to FIG. 4, but as seen from the side.

As shown in FIG. 5, the fourth mirror 164 is at 45° relative to the axis $Y_{II}Y_{II}'$ so as to reflect the Light strip onto the surface 118 to be exposed in a plane that is defined by the axes $X_{II}X_{II}'$ and $Y_{II}Y_{II}'$. To expose the panel 120 in the sole scanning direction $Y_{II}Y_{II}'$, the width of the mirror 164 should be not less than the width $\lambda_{118}$ of the surface 118 to be exposed. To expose a different surface, it suffices to change the mirror 164 or to vary the parameters of the shaper means.

Consequently, depending on the shapes used for the various optical units and depending on how they are disposed in three dimensions, it is possible to obtain a light strip 126 of height $H_{126}$ and of length $L_{126}$ that reaches the surface to be exposed 118.

The mirror 164 must also be adjusted angularly relative to the vertical and horizontal planes by means (not shown) so as to ensure that it remains parallel to the panel during its displacement.

In the above-described configuration for the optical system, it is preferable at a given instant to obtain on the surface 118 to be exposed, a light strip 126 of length $L_{126}$ lying in the range 590 mm to 1 meter (m), and preferably about 780 mm, and of height $H_{126}$ lying in the range 100 mm to 200 mm, and preferably about 170 mm, and with departures from uniformity of about ±10% relative to the mean level of illumination which is situated at around 80 milliwatts per square centimeter ($mW.cm^{-2}$) with a mean angle of incidence less than or equal to 2°, and preferably equal to about 1°.

The travel speed of the mirror 164 determines the quality and the duration of exposure. When the light source 112 is stationary and the mirror 164 moves, the distance between these two elements increases during scanning. It is therefore desirable to vary scanning speed so as to obtain illumination presenting higher quality uniformity over the entire surface to be exposed throughout exposure. Nevertheless, it has been found that when travel speed is constant, it is still possible to comply with the uniformity conditions specified above.

To determine this speed, a photometric sensor 138 (shown in FIG. 6) responsive to ultraviolet rays (UV) is placed in the light flux at the location of the panel to be exposed and is connected to the controller of the exposure apparatus (not shown). The measured value of the light flux power is sent to the controller which calculates the travel speed as a function of said measured light flux power and the parameters of the surface 118 to be exposed, in particular the sensitivity of the material, which parameters are specified to the controller by the operator.

In order to calibrate the device, a laser is advantageously placed at the location of the panel to be exposed to emit visible light towards one of the light sources 112 or 112' (FIG. 1) so as to enable the position of each lamp to be adjusted mechanically by displacement means (not shown) and thus to adjust the position of each reflector so as to ensure that the optical axis of each integrator-collimator assembly of each of the systems $S_1$ and $S_2$ is properly positioned on the axis $Z_{II}Z_{II}'$. This calibration is performed only at the time the apparatus is assembled.

Figure 6:
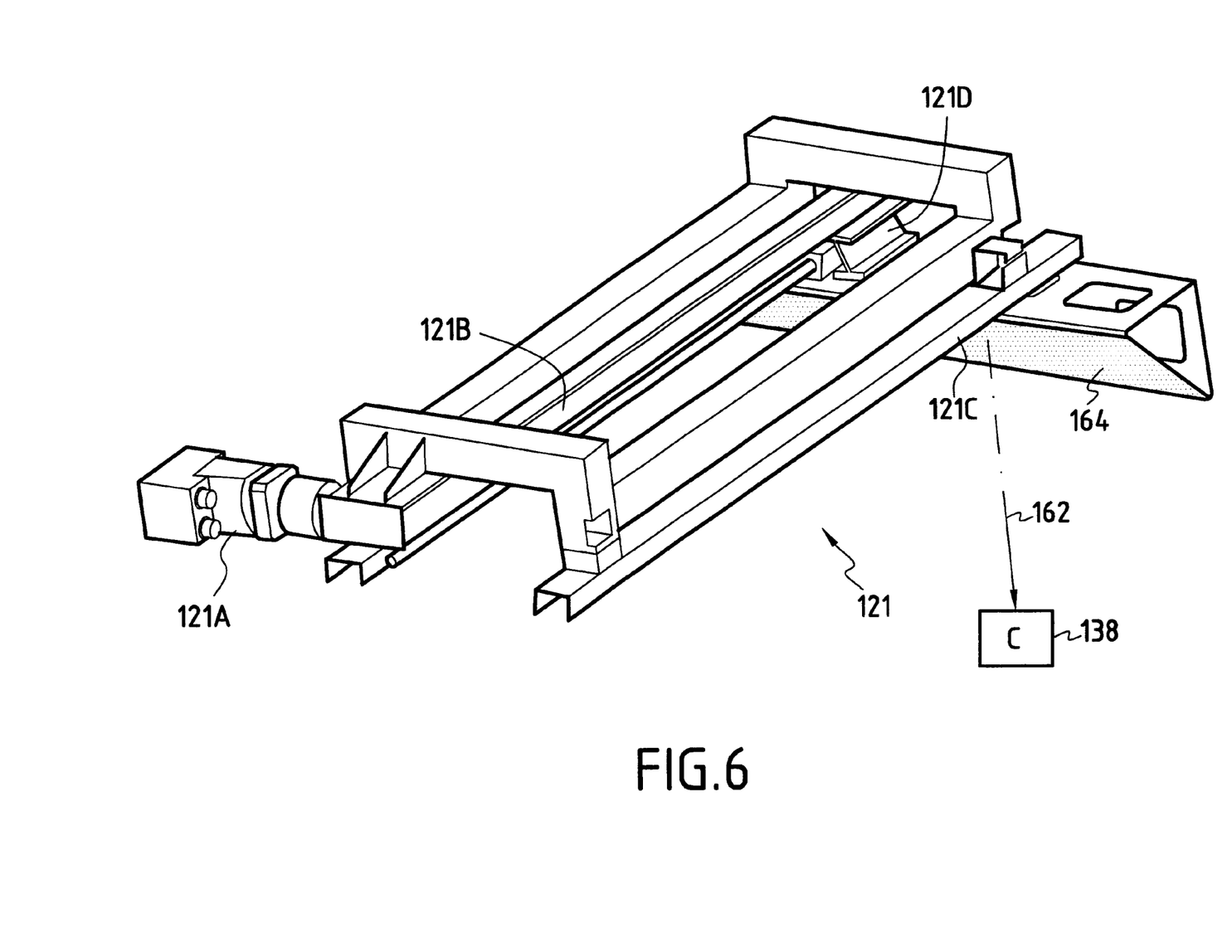
FIG. 6 is a perspective view showing the displacement means.

However, in order to guarantee constant energy for the light strip 126 throughout exposure, matching means (not shown) serve to match the speed of the means 121 for displacing the fourth mirror 164 (see FIG. 6). Specifically, these displacement means 121 co-operating with the apparatus (not shown in FIG. 6) comprise a variable speed motor 121A driving a two-pulley belt 121B and a support 121D that moves on rails 121C and that has the mirror 164 fixed thereto. Any type of known displacement means could be used for moving the mirror 164.

Since the lamp runs at constant electrical power, the speed of the displacement means is varied to compensate for the loss of light power due to the mirror 164 moving progressively away from the lamp 112.

Thus, for example, a starting speed $V_{max}$ for when the mirror 164 is at its closest to the lamp 112 (at the beginning of exposure) is regularly diminished until a minimum value $V_{min}$ once the entire surface 118 has been scanned. The matching means include a servo-control Loop programmed in the controller which serves to calculate and match the speed of the mirror 164.

After a first use, it is essential for the apparatus to be stopped for a considerable length of time (several tens of minutes) before switching the lamps back on again, in particular to make sure that the lamps cool down sufficiently. This off-time also includes the time needed by the lamps to stabilize so that the light they emit is uniform.

Furthermore, the lifetime of a lamp is inversely proportional to the number of times the lamp is switched on and off. To mitigate these drawbacks, the apparatus includes a shutter (not shown) which can be placed in the vicinity of the cylindrical lens 150 to mask the radiation without it being necessary to switch off the lamp 112.

In the second aspect of the invention, the exposure apparatus for manufacturing printed circuits as shown in FIGS. 7 to 12 has an optical system made up of a set of light boxes, each light box having a reflector of a special shape and a discharge lamp enabling a collimated and uniform light strip to be obtained.

In this aspect, the entire optical system, and in particular the light source moves while the panel is stationary.

Figure 7:
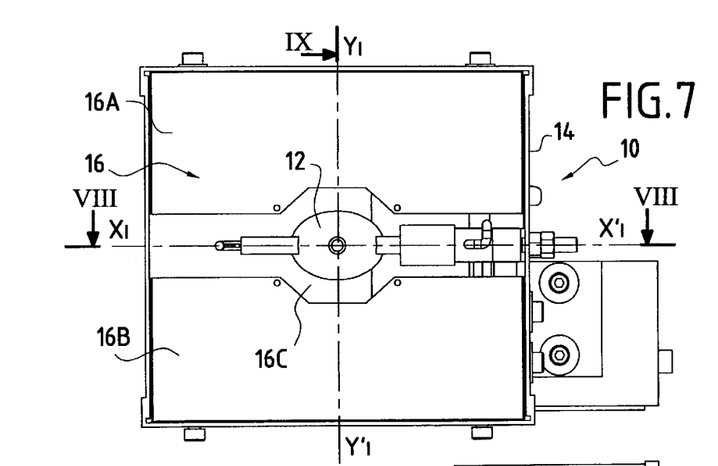
FIG. 7 is a view of a light box in the second aspect of the invention.
Figure 8:
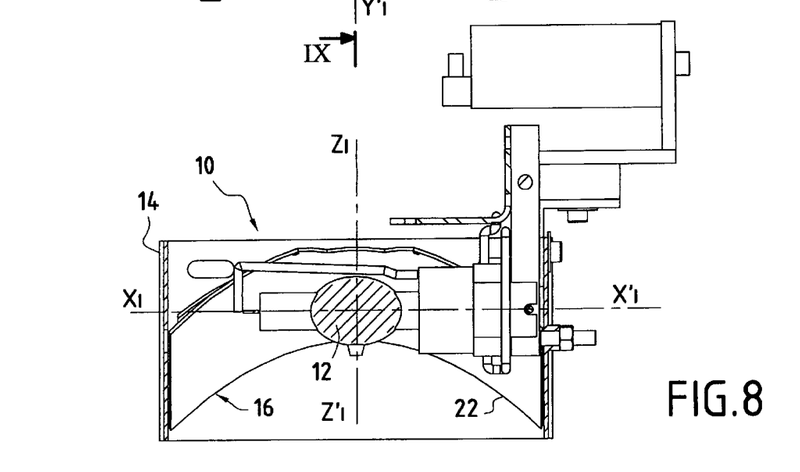
FIG. 8 is a section through the FIG. 7 light box on VIII—VIII.
Figure 9:
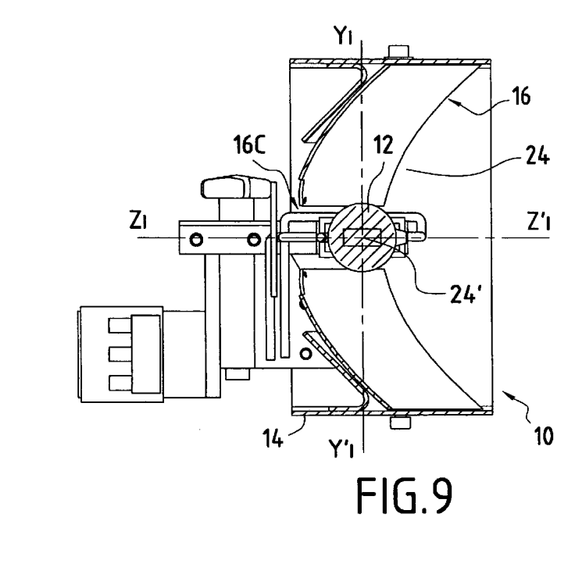
FIG. 9 is a section view through the FIG. 7 light box on IX—IX.

FIG. 7 shows one such light box 10 containing a medium arc discharge lamp 12, where the length of the arc is preferably 20 mm, and its power is 500 watts (W). The lamp 12 is placed in a box 14 also containing a reflector 16.

The need to collimate the light flux as well as possible requires the reflector to be parabolic in shape with the light source being placed at its focus. However, that goes against obtaining good overlap between the light flux delivered by each of the light boxes 10, since that requires a beam which diverges slightly. A compromise must thus be found. The reflector 16 is not circularly symmetrical, but has curvature defined in an orthogonal frame of reference ($X_I X_I'$, $Y_I Y_I'$, $Z_I Z_I'$) by the following equation:

$$z = ax^2 + by^2$$

Taking the axis $X_I X_I'$ as the horizontal axis corresponding to the width direction of the surface 18 of the panel 20 to be exposed which is disposed substantially vertically (shown in FIG. 10 without any artwork or supporting frame), it suffices to move the light box along the axis $Y_I Y_I'$ substantially transversal to the axis $X_I X_I'$ in order to scan the entire surface 18.

The reflector 16 presents a surface formed by a first parabola 24 in a vertical plane defined by the axes $Y_I Y_I'$ and $Z_I Z_I'$ (shown in FIG. 9) and a second parabola 22 in a horizontal plane defined by the axes $X_I X_I'$ and $Z_I Z_I'$ (shown in FIG. 8), respectively having a first focus 24' and a second focus (not referenced) on the axis $Z_I Z_I'$. The lamp 12 is placed at the first focus 24'. As a result, light rays are emitted preferentially along the axis $Z_I Z_I'$. Proper positioning of the lamp 12 in such a reflector 16 determines the collimation and the declination of the light beam. By placing the medium arc lamp 12 in a reflector 16 of shape that satisfies the above equation, an angle of incidence of less than 15° is obtained.

To make such an outline easier to obtain, the reflector 16 is made as two portions 16A and 16B which are symmetrical about the horizontal plane. In addition, to make it easier to change the lamp 12, the reflector has a central opening 16C formed in both portions 16A and 16B of the reflector 16. The two portions 16A and 16B do not meet, but are spaced apart from each other by said opening 16C. The opening 16C is of a suitable shape defined by the shape of the lamp 12.

Figure 10:
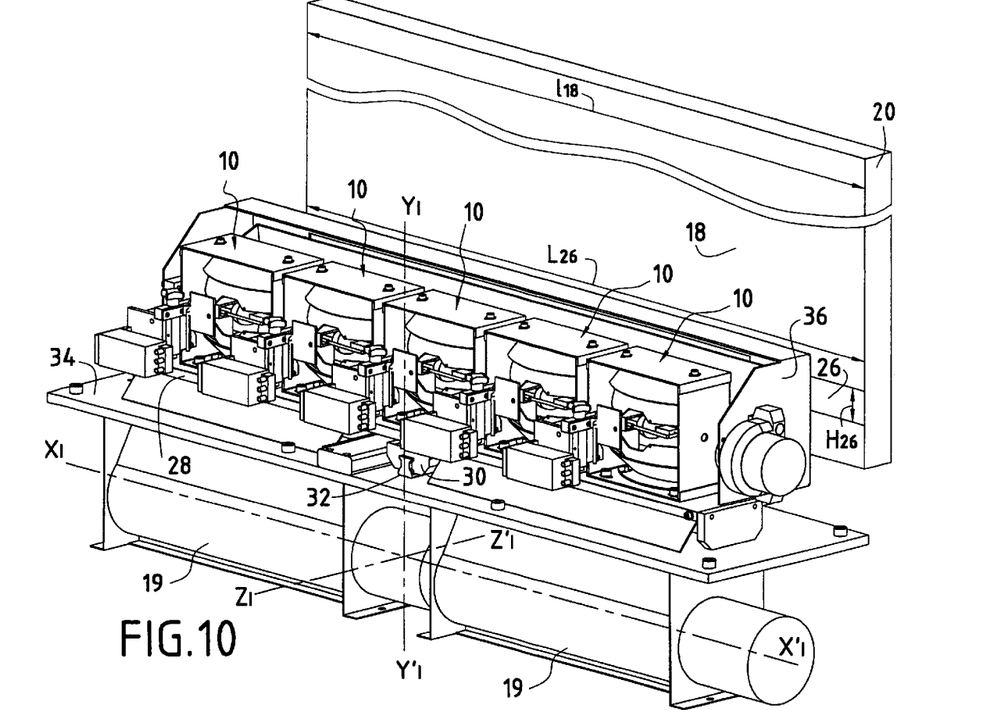
FIG. 10 is a perspective view of a set of five light boxes seen from behind.
Figure 11:
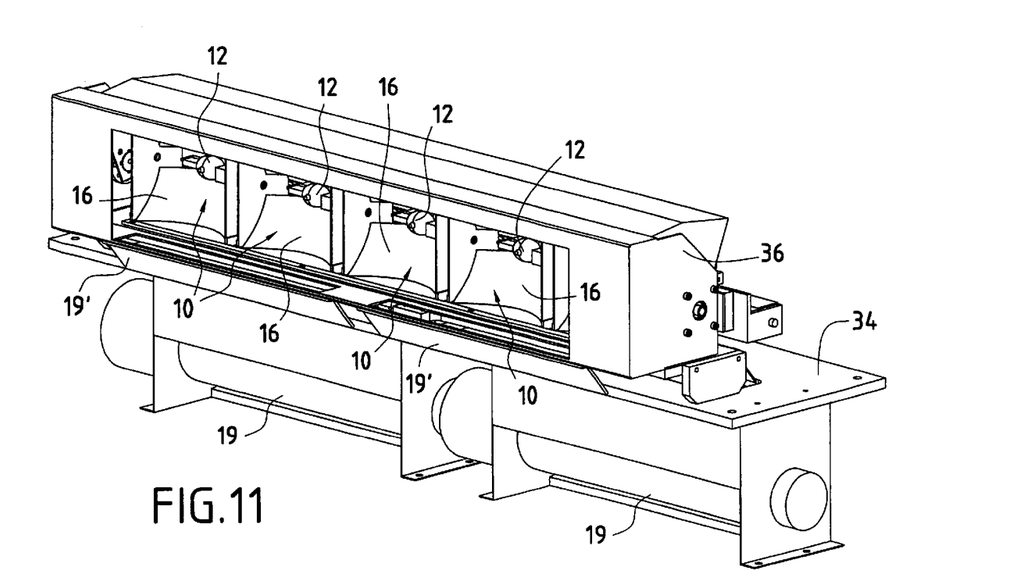
FIG. 11 is a perspective view of the FIG. 10 set of five light boxes, seen from in front.

To obtain a light strip 26 of substantially rectangular shape on the surface 18 with a longitudinal direction along the axis $X_I X_I'$ of length $L_{26}$ equal to the width $\lambda_{18}$ of the surface 18, preferably equal to 635 mm, and of height $H_{26}$ lying in the range 100 mm to 150 mm, and preferably equal to 130 mm, it is preferable to use five light boxes 10 as defined above.

If it is assumed that the panel 20 is placed substantially vertically, it suffices to align five light boxes 10 along the horizontal axis in order to form the light strip 26. The light boxes 10 are spaced apart from one another at a preferred nominal distance of 145 mm, and it is this distance between the light boxes that determines the uniformity of the light beam. Adjusting the position of each light box 10 makes it possible to compensate for errors in the manufacture of a light box 10. This adjustment can preferably extend over an amplitude of ±5 mm about the nominal position.

Under such conditions, the light strip 26 has a medium angle of incidence of about 11° and departures from lighting uniformity of ±10% relative to the mean value which is situated around 120 mW.cm$^{-2}$. As a result half of the light flux reaches the surface 18 at an angle of incidence of less than 11°.

The set of light boxes 10 is placed on a support 28 that can be moved in translation in the horizontal plane in order to adjust the distance between the set of light boxes 10 and the panel 20 to be exposed as a function of the position of the surface to be exposed which in turns depends on the position of the supporting frame (not shown). This distance from the center of the lamp to the panel is preferably 180 mm. This distance determines the quality of the uniformity of the light strip. By way of example, the support 28 is placed on a rail having a dovetailed female portion 30 which slides on a male portion 32 fixed to a driving support 34 which is movable in translation in the vertical direction, i.e. the scanning direction. The displacement means (not shown) comprise a drive system for driving the drive support 34.

As for the apparatus described in the first aspect of the invention, this apparatus includes a shutter 36 fixed to the support 28 and suitable for pivoting in front of the lamps 12. In the closed position (e.g. while loading a panel 20), as shown in FIG. 10, the flux of the light strip 26 is interrupted so the lamps 12 can be left on. The shutter 36 is shown in the open position while a panel 20 (not shown) is being exposed in FIG. 11. The use of such a shutter 36 thus makes it possible to avoid switching off the lamps 12 each time the panel 20 for exposure is changed, thereby reducing the time required to manufacture a printed circuit.

The travel speed of the drive support 34 determines the quality and the duration of exposure. To determine this speed, the operator inputs the characteristics of the surface to be exposed, in particular the sensitivity of the material used, into the computer of a controller for the exposure apparatus (not shown). The travel speed is determined each time there is a change in the type of surface 18 on the panels 20 to be exposed.

Figure 12:
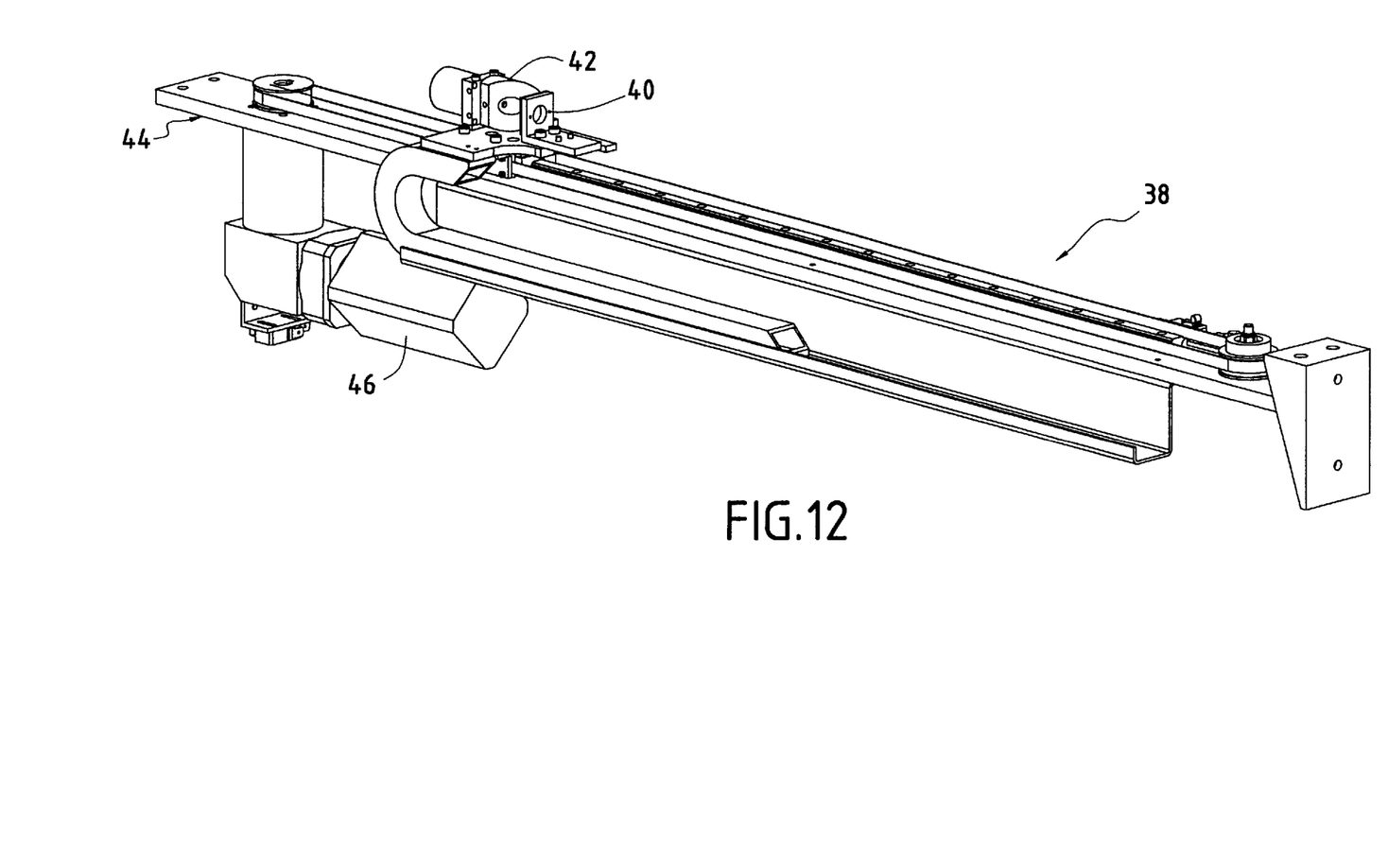
FIG. 12 is a perspective view of the calibration means.

For this purpose, the controller calculates the light power of the light strip 26 on the basis of the light power of each lamp 12. Calibration means 38 including a calibration cell 40 and a dichroic member 42 are placed on a moving support 44. The calibration means are connected to the controller of the exposure apparatus (not shown) so as to deliver the light power of the lamp 12 that is to be calibrated. Using a servo-control loop, the controller adapts the power feed to the lamp 12 so as to obtain the desired power as measured by the calibration means 38.

The lamps 12 are calibrated when the apparatus is switched on in order to monitor stabilization of the lamps 12 and whenever there is a change of lamp 12 or of the type of surface to be exposed.

The calibration means 38 can also be used to monitor the lamps 12 on a regular basis throughout their lifetime. As a lamp ages, the lamp delivers less and less light power for constant electrical power feed. Thus, regularly matching the electrical power fed to the lamp as a function of measured loss in light power delivered serves to ensure that the intensity of the light strip 26 remains substantially constant over time.

The calibration means 38 can be moved by means of a motor 46 so as to be capable of being placed in front of each one of the lamps 12 in the set of light boxes 10.

Once the power of each lamp 12 has been checked, and where appropriate once the operator has input new characteristics for the surface to be exposed, the computer of the controller determines the scanning speed that should be adopted. Matching means (not shown) servo-control the means for displacing the drive support 34. By way of example, these matching means can include a motor which is servo-controlled by a servo-control loop including the controller of the apparatus. The loop is defined directly by the controller as a function of the desired light power and of the type of surface.

To avoid excessively heating the artwork (not shown), it is cooled by having cold air blown onto it. Specifically, with reference to FIGS. 10 and 11, the apparatus includes tangential fans 19 placed beneath the light boxes 10 to blow cold air towards deflectors 19' serving to generate a sheet of air that propagates towards the surface to be exposed 18 and the artwork, and more specifically towards that zone of the artwork that is exposed to the strip of light 26.

What is claimed is:

1. Apparatus for exposing to light a substantially rectangular surface of at least one face of a panel through at least one artwork, said surface having a sensitivity, said apparatus comprising:

a frame;

means for holding said at least one artwork and said panel on said frame;

an optical system comprising a light source emitting a light beam, processor means for processing said light beam to generate a uniform and collimated light beam having a mean angle of incidence relative to said surface to the exposed of less than or equal to 2° and having illumination uniformity that departs by less than ±10% from a mean value, and shaper means to transform said uniform and collimated light beam into a uniform and collimated light strip having a length on said surface of said panel to be exposed and including said artwork, said length of said uniform and collimated light strip being not less than the length of one of the sides of said surface to be exposed, said means for processing said light beam comprising a reflector and an integrator-collimator assembly;

displacement means for generating relative displacement between said light strip and said surface to be exposed in a direction substantially transverse to the length of said light strip; and matching means for matching the speed of said relative displacement between said light strip and said surface to be exposed to said illumination of said light strip and to said sensitivity of said surface to be exposed.

2. Apparatus according to claim 1, wherein said reflector comprises a portion of an ellipsoid of revolution presenting a first focus and a second focus.

3. Apparatus according to claim 1, wherein said integrator-collimator assembly comprises:

a first optical processor unit for distributing the light in substantially uniform manner; and a second optical processor unit presenting an object focus, said second optical processor unit being placed after said first optical processor unit and being designed to collimate the light.

4. Apparatus according to claim 3, wherein said first optical processor unit is placed at the second focus of said reflector so that said first optical processor unit transforms said light beam entering it into an outlet light beam that is uniform.

5. Apparatus according to claim 4, wherein said first optical processor unit is placed at the object focus of said second optical processor unit such that said second optical processor unit enables said uniform light beam entering said second optical processor unit to be transformed into a light beam that is substantially uniform and collimated.

6. Apparatus according to claim 3, wherein said first optical processor unit comprises a cylindrical integrating lens having a radius of curvature lying substantially within the range of from about 30 mm to about 40 mm.

7. Apparatus according to claim 3, wherein said second optical processor unit comprises a spherical collimator lens having a radius of curvature lying substantially within the range of from about 150 mm to about 200 mm.

8. Apparatus according to claim 7, wherein said integrator-collimator assembly further comprises:

a first mask placed in the vicinity of said first optical unit; and a second mask placed in the vicinity of said second optical unit.

9. Apparatus according to claim 2, wherein said light source is disposed at the first focus of said reflector.

10. Apparatus according to claim 1, further comprising at least one-dichroic mirror between said light source and said integrator-collimator assembly.

11. Apparatus according to claim 1, wherein said shaper means comprise a first shaper optical unit and a second shaper optical unit which are disposed in succession at the outlet of said integrator-collimator assembly.

12. Apparatus according to claim 11, wherein said first shaper optical unit comprises a diverging mirror which is convex and has a first radius of curvature, and wherein said second shaper optical unit comprises a converging mirror which is concave and has a second radius of curvature.

13. Apparatus according to claim 12, wherein said diverging and converging mirrors are spaced apart by a spacing distance, and wherein the length of sail uniform and collimated light strip is a function of said spacing distance and of said radii of curvature of said converging and diverging mirrors.

14. Apparatus according to claim 1, wherein said displacement means comprise a plane mirror movable in a plane defined by the sides of said exposed surface.

15. Apparatus for exposing to a light substantially rectangular surface of at least one face of a panel through at least one artwork, said surface having a sensitivity, said apparatus comprising:

a frame;

means for holding at least said one artwork and said panel on said frame;

an optical system comprising at least one light box containing a light source and a reflector comprising at least a first parabola having a first focus and a second parabola having a second focus, said first and second focuses being situated on the propagation axis of light towards said surface to be exposed, said light source being placed at said first focus to generate a light strip on said surface of the panel to be exposed and including said artwork, having a mean angle of incidence relative to said surface to be exposed of less than or equal to 15° and having illumination uniformity that departs by less than +10% from a mean value, said length of said light strip being not less than the length of one of said sides of said surface to be exposed;

displacement means for generating relative displacement between said light strip and said surface to be exposed in a direction substantially transverse to said length of said light strip; and matching means for matching the speed of said relative displacement between said light strip and said surface to be exposed to said illumination of the light strip and to said sensitivity of said surface to be exposed.

16. Apparatus according to claim 15, wherein said first parabola is disposed in a first plane defined by axes including said propagation axis, and said second parabola is disposed in a second plane defined by said axes including said propagation axis and substantially transversal to said first plane.

17. Apparatus according to claim 15, wherein said reflector comprises at least two symmetrical portions.

18. Apparatus according to claim 15, wherein said reflector further includes a central opening to facilitate changing said light source.

19. Apparatus according to claim 15, wherein said optical system comprises five light boxes in alignment along a direction substantially transverse to said relative displacement.

20. Apparatus according to claim 19, wherein each of said light boxes can be displaced, relative to the others of said light boxes, along said length of said light strip.

21. Apparatus according to claim 1, wherein said uniform and collimated light strip forms a quadrilateral of height lying substantially within the range of from about 100 mm to about 150 mm, and of length not less than said width of said surface to be exposed.

22. Apparatus according to claim 1, further comprising a photometric sensor for measuring a light flux power.

23. Apparatus according to claim 1, wherein said light source comprises an electric discharge lamp.

24. Apparatus according to claim 1, wherein said matching means additionally enables a speed of relative displacement between said light strip and said face to be exposed to be varied during exposure.

25. Apparatus according to claim 1, wherein said light source comprises a medium arc electric discharge lamp.

26. Apparatus according to claim 1, wherein said light source comprises a short arc electric discharge lamp.

27. Apparatus according to claim 15, further comprising calibration means for calibrating each light source independently of the others.

28. Apparatus according to claim 27, wherein said calibration means are movable in front of each of said plurality of light sources.

* * * * *